United States Patent [19]

Mueller et al.

[11] Patent Number: 5,777,376
[45] Date of Patent: Jul. 7, 1998

[54] PNP-TYPE BIPOLAR TRANSISTOR

[75] Inventors: Karlheinz Mueller, Waldkraiburg; Holger Poehle, Taufkirchen, both of Germany

[73] Assignee: Siemens Aktiengesellschaft, Munich, Germany

[21] Appl. No.: 657,411

[22] Filed: Jun. 3, 1996

[30] Foreign Application Priority Data

Jun. 1, 1995 [DE] Germany ............ 195 20 182.5

[51] Int. Cl.$^6$ ............................................ H01L 29/00
[52] U.S. Cl. ............................................ 257/557; 257/591
[58] Field of Search ............................ 257/557, 560, 257/565, 591

[56] References Cited

U.S. PATENT DOCUMENTS

| | | | |
|---|---|---|---|
| 3,524,113 | 8/1970 | Agusta et al. | 257/557 |
| 3,667,006 | 5/1972 | Ruegg | 257/557 |
| 4,196,440 | 4/1980 | Anantha et al. | 257/557 |
| 5,347,156 | 9/1994 | Sakaue | 257/557 |

FOREIGN PATENT DOCUMENTS

| | | | |
|---|---|---|---|
| 63-67775 | 3/1988 | Japan | 257/557 |
| 1-258462 | 10/1989 | Japan | 257/557 |
| 3-159245 | 7/1991 | Japan | 257/557 |

*Primary Examiner*—Mark V. Prenty
*Attorney, Agent, or Firm*—Herbert L. Lerner; Laurence A. Greenberg

[57] ABSTRACT

A pnp-type bipolar transistor includes a highly dop p-conducting emitter zone, a base zone and a buried n-conducting zone below the emitter zone. An additional p-conducting region is connected to the highly doped emitter zone and is disposed between the highly doped emitter zone and the buried zone. A collector zone includes a highly doped collector connection zone and a p-conducting region reaching from the collector connection zone to the buried zone.

6 Claims, 2 Drawing Sheets

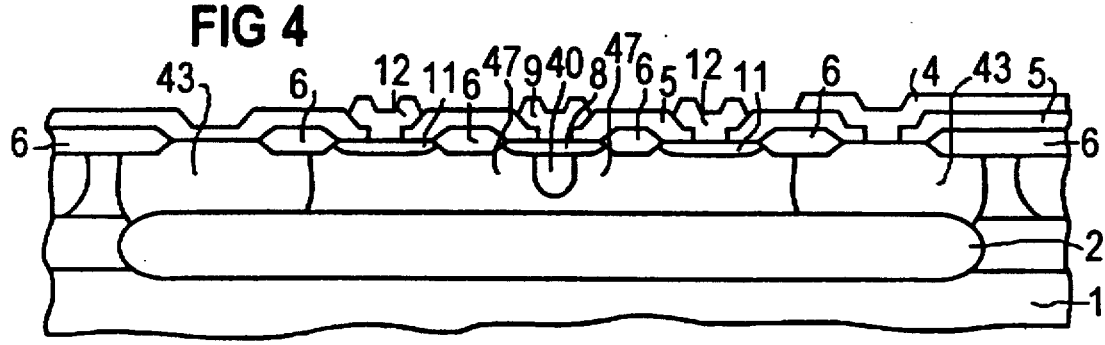
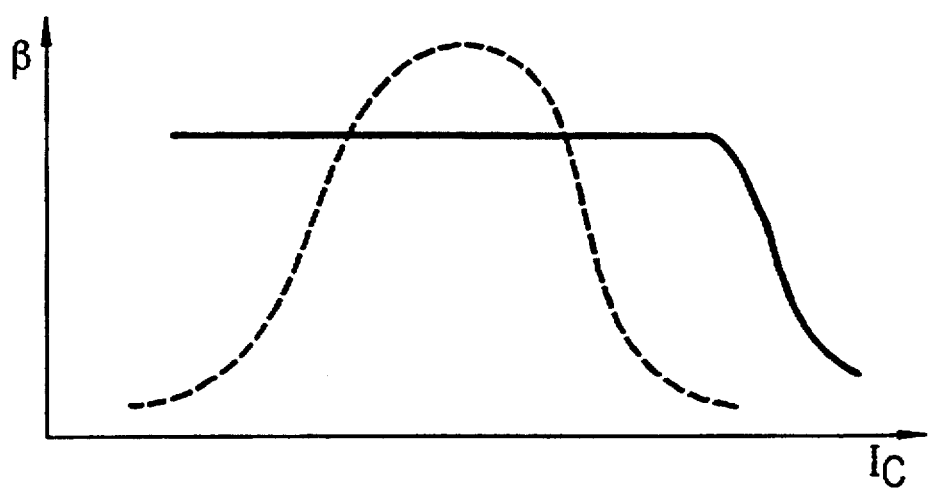

PNP-TYPE BIPOLAR TRANSISTOR

BACKGROUND OF THE INVENTION

FIELD OF THE INVENTION

The invention relates to a pnp-type bipolar transistor having a highly doped p-conducting emitter zone, a base zone and a collector zone, as well as a buried n-conducting zone being disposed below the emitter zone.

The structure of bipolar transistors is disclosed in the publication entitled: Technologie integrierten Schaltungen [Integrated Circuit Technology], by D. Widmann, H. Mader and H. Friedrich, Springer-Verlag, 1988. The above-mentioned pub-transistors are produced in accordance with the npn-type transistors described in that publication. Typically, the highly doped p-conducting emitter zone, which is connected through a contact hole with a metallic strip conductor, is surrounded by a p-conducting collector zone that is also connected through contact regions with metallic strip conductors. The emitter and collector zones are disposed in an n-conducting trough serving as the base and are insulated from each other by insulating zones, for example through a LOCOS insulation. The n-trough which serves as the base has a highly doped buried n-conducting zone below it and is surrounded, in lateral direction, by a highly doped n-conducting trench or channel which is insulated from the collector zone and which is connected through a contact hole with a metallic strip conductor. The highly doped n-conducting zones of the buried zone and the trench or channel thus effect low-resistance contacting of the n-base trough.

In such a lateral pnp-transistor, a hole current injected by the emitter is divided into a useful part and a parasitic part. The useful part flows through the base in lateral direction to the collector zone while the parasitic part typically flows in substantially vertical direction through the buried zone into the substrate which is also p-conducting. Physically, that means that underneath the emitter, the drift field forms holes which recombine with electrons of the base and the buried zone. A base current containing parasitic parts must therefore be created. Overall, that results in a low current gain and a low maximum collector current for the lateral pnp-transistor.

SUMMARY OF THE INVENTION

It is accordingly an object of the invention to provide a pnp-type bipolar transistor, which overcomes the herein-aforementioned disadvantages of the heretofore-known devices of this general type and which has improved characteristics.

With the foregoing and other objects in view there is provided, in accordance with the invention, a pnp-type bipolar transistor, comprising a highly doped p-conducting emitter zone; a base zone; a buried n-conducting zone below the emitter zone; an additional p-conducting region being connected to the highly doped emitter zone and disposed between the highly doped emitter zone and the buried zone; and a collector zone including a highly doped collector connection zone and a p-conducting region reaching from the collector connection zone to the buried zone.

In accordance with another feature of the invention, the additional region is column-shaped underneath the highly doped emitter zone.

In accordance with a further feature of the invention, the additional region is cup-shaped underneath the highly doped emitter zone.

In accordance with an added feature of the invention, the highly doped emitter zone has a given cross-sectional width, and the additional region has a cross-sectional width being less than the given cross-sectional width.

In accordance with an additional feature of the invention, the additional region connects the highly doped emitter zone with the buried zone.

In accordance with yet another feature of the invention, the additional region is doped less than the highly doped emitter zone by at least two orders of magnitude.

In accordance with yet a further feature of the invention, there is provided a base terminal of the transistor, and a highly doped n-conducting zone connecting the buried zone to the base terminal.

In accordance with a concomitant feature of the invention, the additional region is laterally connected to one side of the base zone, and the collector zone is laterally connected to another side of the base zone.

Other features which are considered as characteristic for the invention are set forth in the appended claims.

Although the invention is illustrated and described herein as embodied in a pnp-type bipolar transistor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings

BRIEF DESCRIPTION OF THE DRAWINGS

FIG. 4 is a view similar to FIG. 1 of a third pnp-transistor according to the invention; and FIG. 5 is a diagram illustrating current gain as a function of collector current.

DESCRIPTION OF THE PREFERRED EMBODIMENTS

Figure 1:
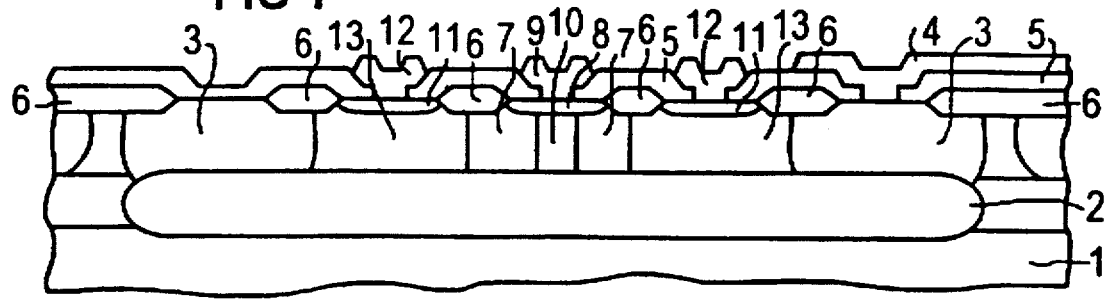
FIG. 1 is a fragmentary, diagrammatic, longitudinal-sectional view of a first pnp-transistor or according to the invention.

Referring now to the figures of the drawings in detail and first, particularly, to FIG. 1 thereof, there is seen a highly doped n-conducting zone 2 which is disposed in a p-conducting substrate 1. An outer region of the zone 2 is connected through an annular buried zone 3 to a surface of the semiconductor configuration. The zone 3 is also n-conducting and is highly doped. A metallic strip conductor 4 reaches through a contact hole in an insulating layer 5 down to the conducting zone 3. The strip conductor 4 represents a base connector and the zones 2 and 3 serve as a low-resistance connection to the base. The highly doped zones 3 are insulated from adjacent regions on the surface of the semiconductor configuration by insulating regions 6 which can, for example, represent a LOCOS insulation.

It is diagrammatically indicated that additional transistor structures are connected outside the area defined by the zones 2 and 3, for example in BICMOS technology. It is therefore possible for a highly doped lateral p-conducting layer to be provided on the outside of the n-conducting zone 3, from which a p-conducting trench or channel region that is only suggested in the drawing reaches down to the LOCOS insulation region 6 underneath this region.

An n-conducting base 7 lies within the area defined by the zones 2 and 3. As is seen in the direction of the surface of the semiconductor configuration, the base 7 is connected with a highly doped p-conducting emitter zone 8 which is contacted for emitter connection with a metallic strip conductor 9 through a contact hole in the insulation layer 5.

An additional p-conducting region 10 which is in the form of a column is disposed between the highly doped emitter zone 8 and the buried zone 2. The column-shaped region 10 reaches from the highly doped emitter zone 8 to the buried zone 2. As is shown in the longitudinal section of FIG. 1, the column-shaped additional region 10 is disposed underneath the highly doped emitter zone 8 in such a way that its outer regions bordering the n-conducting base 7 lie within the region defined by outer dimensions of the highly doped emitter zone 8. As a result, in the illustrated configuration the highly doped emitter zone forms a capital to the column-shaped additional region 10.

The doping of the emitter zone 8 is approximately $10^{20}$ to $10^{21}$ while the doping of the additional region 10 ranges approximately from $10^{16}$ to $10^{18}$ cm$^{-3}$.

A collector zone 11, which can be formed in such a way as to be annular as seen in a plan view or open and which is insulated, for example, by the LOCOS regions 6 from the zones 3 and 8, respectively, is disposed between the emitter region with highly doped emitter zone 8 and the additional region 10 as well as the trench or channel-shaped base zone 3. The collector zone 11 is contacted with a metallic strip conductor 12 through a contact hole in the insulating layer 5. The first exemplary embodiment provides for a p-doped trough 13 as a collector underneath the collector zone 11. The collector 13 is thereby connected through the highly doped collector zone 11 with the strip conductor connection wire 12.

The additional p-doped region 10 formed underneath the highly doped emitter zone 8 has the effect of reducing a cloud of holes within the base, a well known phenomenon in configurations according to prior art, in such a way that fewer holes recombine with electrons of the base or of the buried zone 2. As a result, base current is reduced and current gain increased. The increase in p-concentration in the emitter region continues to make it possible to obtain an increased maximum collector current, especially with large injected currents. The p-conducting additional region 10 can be produced in a similar manner to the trough region 13, that is by implantation through the use of mask techniques and a subsequent restoration step. A change in the process being employed is not required, only a change in the mask.

Figure 2:
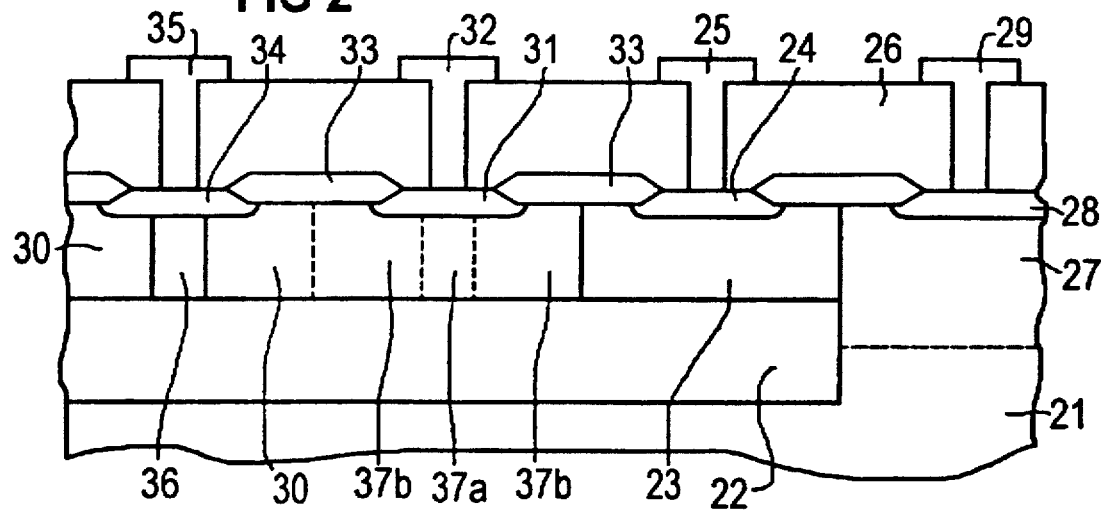
FIG. 2 is a view similar to FIG. 1 of a second pnp-transistor according to the invention.

FIG. 2 shows a highly diagrammatic longitudinal-sectional segment of an additional embodiment of a bipolar pnp-type transistor. A buried zone 22 is disposed in a substrate 21 of p-conductivity. This buried zone 22 is connected through a highly doped n-conducting trench or channel region 23 with a highly doped n-conducting base zone 24. The highly doped base connection zone 24 is contacted by a metallic base connector 25 which reaches through a contact hole in an insulating layer 26 to the base connection zone 24. The substrate 21 is connected through a p-conducting layer 27 with a highly doped p-conducting zone 28 which is contacted by a metallic strip conductor 29 through a contact hole in the insulating layer 26.

The regions 28 and 29 form a substrate connection of the transistor configuration.

An n-conducting base 30 is located in a trough formed by the zones 22 and the trench or channel-shaped connection 23. A highly doped p-conducting collector connection zone 31 lies between the base 30 and the base connection zone 24, as is seen in lateral direction. The collector connection zone 31 is contacted through the use of a metallic collector connector 32 and a contact hole in the insulating layer 26. The collector connection zone 31 is insulated on either side, for example through the use of LOCOS insulations 33, with respect to the base connection zone 24 on one hand and a highly doped emitter zone 34 which is disposed within the base 30 on the other hand. The highly doped emitter zone 34 is connected with a metallic emitter connector 35 through a contact hole in the insulating layer 26.

An additional p-conducting emitter region 36 is column-shaped and disposed below the highly conductive emitter zone 34 in such a way that the zone 34 forms a capital to the column 36. As is depicted in FIG. 2, this means that as is seen in longitudinal section, the column width of the zone 36 is narrower than the width of the zone 34. The width of the column is adjusted in such a way that a space-charge zone, which forms between the additional emitter zone 36 and the adjacent base as a result of collector-emitter potential when voltage is applied, does not extend beyond an outer edge of the highly doped emitter zone 34. A person skilled in the art will be familiar with such column width adjustment of the additional zone 36 which is a function of the respective manufacturing process. Due to the fact that the effective emitter region, as with previous structures, is also defined by the highly doped zone 34, the collector-emitter breakdown voltage corresponds with such known structures and is essentially determined by the zones 34 and 31.

Zones 37a or alternatively 37b, indicate the possibility of creating a collector trough underneath the collector zone 31. As the figure indicates by broken lines, the base region 30 is thereby made narrower in every case. Similarly to the emitters, the p-doped collector trough may be provided with a column-type region 37a or a trough 37b that is wider than the highly doped collector zone 31. The advantage of this configuration is improved current yield (improved hole transport).

Figure 3:
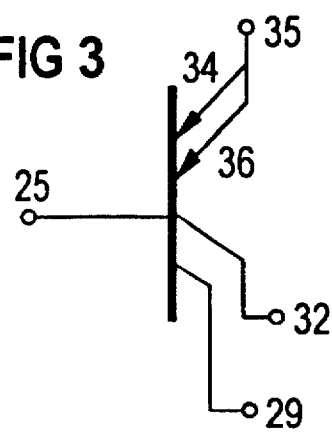
FIG. 3 is an equivalent schematic circuit diagram of the transistor structure according to FIG. 2.

FIG. 3 shows an equivalent circuit diagram of the configuration according to FIG. 2. The emitter, starting with the emitter contact 35, acts as a double emitter with the highly doped emitter zone 34 and the additional column-shaped emitter region 36.

FIG. 4 shows a third exemplary embodiment which essentially differs from the example of FIG. 1 in that an epitaxial layer 47 which acts as a base and lies above the buried n-conducting zone 2 is thicker than the zone 7. Accordingly, a trench or channel zone 43 is thicker than the zone 3. A collector trough below the collector zone, such as the trough 13 in FIG. 1, is not provided. An additional region 40 below the highly doped emitter zone 8 is not column-shaped but rather cup-shaped and, starting from the emitter zone 8, does not reach all the way to the buried zone 2. The depth of the additional cup-shaped region 40 preferably reaches downward from the emitter zone 8 by more than half the thickness of the epitaxial layer 47.

FIG. 5 graphically shows a current gain β as a function of a collector current Ic. A solid line shows nearly constant current gain up to high collector currents. A broken line shows a function β (I$_c$) for known transistor structures. The bipolar transistor according to the invention therefore permits both uniform current gain as well as substantially higher collector currents as compared to known configurations. The order of magnitude of the collector gain in the exemplary embodiments ranges between 10% and approximately 20%.

We claim:

1. A pnp-type bipolar transistor, comprising;

a highly doped p-conducting emitter zone;

a base zone;

a buried n-conducting zone below said emitter zone;

an additional p-conducting region being connected to said highly doped emitter zone and disposed between said highly doped emitter zone and said buried zone, said additional p-conducting region being doped less than said highly doped p-conducting emitter zone by at least two orders of magnitude;

a collector zone including a highly doped collector connection zone and a p-conducting region reaching from said collector connection zone to said buried zone; and said highly doped p-conducting emitter zone having a given cross-sectional width, and said additional p-conducting region having a cross-sectional width being less than said given cross-sectional width.

2. The bipolar transistor according to claim 1, wherein said additional region is column-shaped underneath said highly doped emitter zone.

3. The bipolar transistor according to claim 1, wherein said additional p-conducting region is cup-shaped underneath said highly doped emitter zone.

4. The bipolar transistor according to claim 1, wherein said additional region connects said highly doped emitter zone with said buried zone.

5. The bipolar transistor according to claim 1, including a base terminal of the transistor, and a highly doped n-conducting zone connecting said buried zone to said base terminal.

6. The bipolar transistor according to claim 1, wherein said additional region is laterally connected to one side of said base zone, and said collector zone is laterally connected to another side of said base zone.

* * * * *